(12) United States Patent
Chen

(10) Patent No.: US 12,550,468 B2
(45) Date of Patent: *Feb. 10, 2026

(54) PHOTO-SENSING DEVICE AND MANUFACTURING METHOD THEREOF

(71) Applicant: Taiwan Semiconductor Manufacturing Company, Ltd., Hsinchu (TW)

(72) Inventor: Chia-Chan Chen, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/844,752

(22) Filed: Jun. 21, 2022

(65) Prior Publication Data

US 2022/0320169 A1   Oct. 6, 2022

Related U.S. Application Data

(63) Continuation of application No. 16/719,987, filed on Dec. 19, 2019, now Pat. No. 11,398,512.

(51) Int. Cl.
*H10F 39/00* (2025.01)
*H10F 77/40* (2025.01)

(52) U.S. Cl.
CPC ......... *H10F 39/806* (2025.01); *H10F 39/024* (2025.01); *H10F 77/413* (2025.01); *H10F 39/8037* (2025.01); *H10F 39/8053* (2025.01); *H10F 39/8063* (2025.01); *H10F 39/807* (2025.01); *H10F 39/811* (2025.01)

(58) Field of Classification Search
CPC ......... H01L 27/14625; H01L 27/14685; H01L 31/02327; H01L 27/14612; H01L 27/14621; H01L 27/14627; H01L 27/1463; H01L 27/14636; H01L 27/14643; H01L 27/14689; H10F 39/806
See application file for complete search history.

(56) References Cited

U.S. PATENT DOCUMENTS

| | | | | |
|---|---|---|---|---|
| 7,064,405 | B2 * | 6/2006 | Kondo | H01L 27/14806 438/69 |
| 11,398,512 | B2 * | 7/2022 | Chen | H01L 31/02327 |
| 2006/0049439 | A1 * | 3/2006 | Oh | H01L 27/14625 257/292 |
| 2008/0135962 | A1 * | 6/2008 | Ryu | H01L 27/14621 257/E31.127 |
| 2009/0090944 | A1 * | 4/2009 | Park | H01L 27/14645 257/292 |

(Continued)

FOREIGN PATENT DOCUMENTS

| | | | | |
|---|---|---|---|---|
| JP | 2006049825 A | * | 2/2006 | ....... H01L 27/14625 |
| WO | WO-2012070165 A1 | * | 5/2012 | ....... H01L 27/14627 |

*Primary Examiner* — Bitew A Dinke
(74) *Attorney, Agent, or Firm* — JCIPRNET

(57) ABSTRACT

A photo-sensing device includes a semiconductor substrate, a photosensitive device, a dielectric layer and a light pipe. The photosensitive device is in the semiconductor substrate. The dielectric layer is over the semiconductor substrate. The light pipe is over the photosensitive device and embedded in the dielectric layer. The light pipe includes a curved and convex light-incident surface.

20 Claims, 16 Drawing Sheets

(56) References Cited

U.S. PATENT DOCUMENTS

| | | | |
|---|---|---|---|
| 2009/0189055 A1* | 7/2009 | Lin | H01L 27/14621 |
| | | | 250/208.1 |
| 2010/0163714 A1* | 7/2010 | Wober | H01L 27/14643 |
| | | | 250/227.2 |
| 2012/0155797 A1* | 6/2012 | Zhang | G02B 6/43 |
| | | | 438/31 |
| 2013/0001724 A1* | 1/2013 | Masuda | H01L 27/14629 |
| | | | 257/E31.127 |
| 2017/0250211 A1* | 8/2017 | Chang | H01L 27/14643 |
| 2019/0148430 A1* | 5/2019 | Chu | H01L 27/1464 |
| | | | 257/432 |

* cited by examiner

PHOTO-SENSING DEVICE AND MANUFACTURING METHOD THEREOF

CROSS-REFERENCE TO RELATED APPLICATION

This application is a continuation application of and claims the priority benefit of a prior application Ser. No. 16/719,987, filed on Dec. 19, 2019 and now allowed. The entirety of the above-mentioned patent application is hereby incorporated by reference herein and made a part of this specification.

BACKGROUND

Integrated circuits (ICs) with image sensors are used in a wide range of modern day electronic devices, such as, for example, cameras and cell phones. In recent years, complementary metal-oxide semiconductor (CMOS) image sensors have begun to see widespread use, largely replacing charge-coupled device (CCD) image sensors. Compared to CCD sensors, a CMOS image sensor has many advantages such as low voltage operation, low power consumption, compatibility with logic circuitry, random access, and low cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
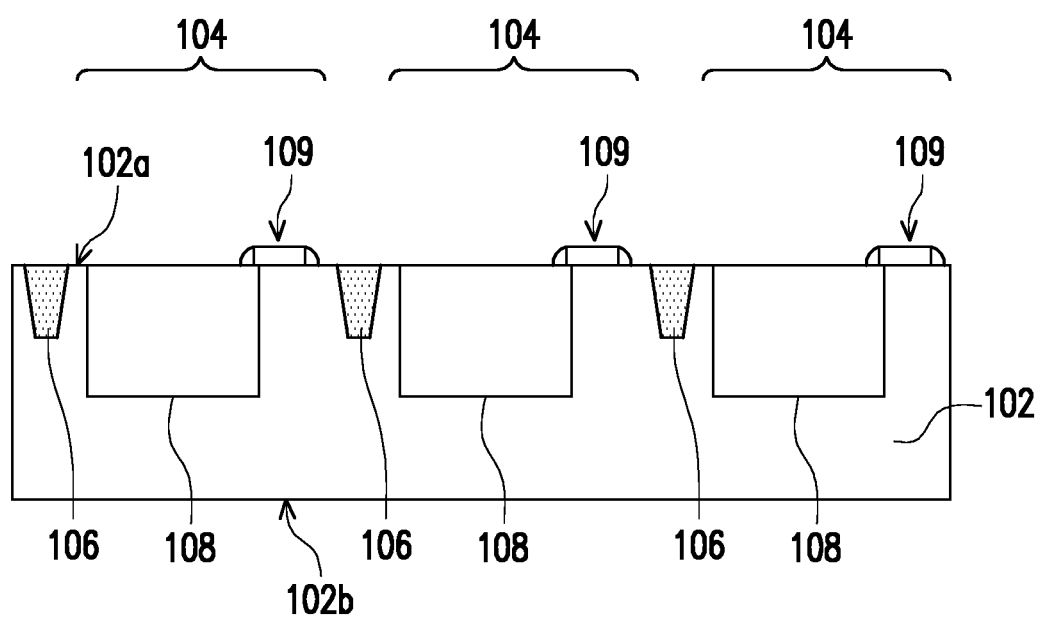
FIG. 1 to FIG. 8 are schematic cross-sectional views illustrating various stages in a manufacturing method of an image sensor according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 8 are schematic cross-sectional views illustrating various stages in a manufacturing method of an image sensor 10 according to some embodiments of the present disclosure. The image sensor 10 may be, for example, a CMOS image sensor, and/or an integrated circuit (IC) die or chip.

Referring to FIG. 1, a semiconductor substrate 102 including a plurality of active areas 104 is provided. Specifically, the semiconductor substrate 102 has a first surface 102a and a second surface 102b opposite to the first surface 102a. A plurality of isolation structures 106 are formed in the semiconductor substrate 102 and extend from the first surface 102a of the semiconductor substrate 102 toward the interior of the semiconductor substrate 102. In other words, the isolation structures 106 are formed to be embedded in the semiconductor substrate 102. In some embodiment, the isolation structures 106 may, for example, be shallow trench isolation (STI) structures. The formation process of the isolation structures 106 may be attained by the following steps. First, a plurality of shallow trenches having a predetermined depth are formed in the semiconductor substrate 102 by, for example, photolithograph/etching process or other suitable patterning processes. Then, a dielectric layer is deposited in the trenches. Subsequently, a portion of the dielectric layer is removed (e.g., polishing, etching, or a combination thereof) to form the isolation structures 106 (i.e. the STI structures). In some alternative embodiments, the isolation structures 106 may be deep trench isolation (DTI) structures, implant isolation structures, or other insulating structures to separate the active areas 106.

In some embodiments, a material of the semiconductor substrate 102 includes silicon, and a material of the isolation structures 106 (i.e. the STI structures) includes silicon oxide, silicon nitride, silicon oxynitride, other suitable materials, or a combination thereof. In some alternative embodiments, the semiconductor substrate 102 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

As shown in FIG. 1, a plurality of photosensitive devices 108 are formed in the active areas 104. The photosensitive devices 108 are configured to absorb radiation incident on the photosensitive devices 108 to generate an electric signal. In some embodiments, the photosensitive devices 108 are formed through ion implantation on the first surface 102a of the semiconductor substrate 102. For example, the photosensitive devices 108 are photodiodes. Each of the photodiodes may include at least one p-type doped region, at least one n-type doped region, and a p-n junction formed between the p-type doped region and the n-type doped region. In detail, when the semiconductor substrate 102 is a p-type substrate, n-type dopants (e.g., phosphorous or arsenic) may be doped into the active areas 104 of the semiconductor substrate 102 to form n-type wells, and the resulting p-n junctions in the active areas 104 are able to perform the image sensing function. Similarly, when the semiconductor substrate 102 is an n-type substrate, p-type dopants (e.g., boron or $BF_2$) may be doped into the active areas 104 of the semiconductor substrate 102 to form p-type wells, and the resulting p-n junctions in the active areas 104 are able to perform the image sensing function. Detailed descriptions of ion implantation processes for forming n-type doped regions (wells) or p-type doped regions (wells) are omitted herein. When a reversed bias is applied to the p-n junctions of the photosensitive devices 108, the p-n junctions are sensitive to an incident light. The light received or detected by the photosensitive devices 108 is converted into photo-current such that analog signal representing intensity of the photo-current is generated. In some alternatively embodiments, the photosensitive devices 108 may be other photoelectric elements capable of performing image sensing function. For example, the photosensitive devices 108 may include a p-i-n junction, where an intrinsic semiconductor region may be arranged between and contacting the n-type doped region and the p-type doped region.

In some embodiments, one or more transistors 109 may be formed on the first surface 102a of the semiconductor substrate 102. The one or more transistors 109 is designate for receiving signal originated from the photosensitive devices 108. In some embodiments, the one or more transistors 109, for example, may be transfer gate transistors configured to selectively transfer charge accumulated in the photosensitive devices 108 out of the photosensitive devices 108 for readout. In some embodiments, other transistors (not shown) may also be formed on the first surface 102a of the semiconductor substrate 102, such as source-follower transistors, row select transistors, reset transistors, or a combination thereof.

Figure 2:
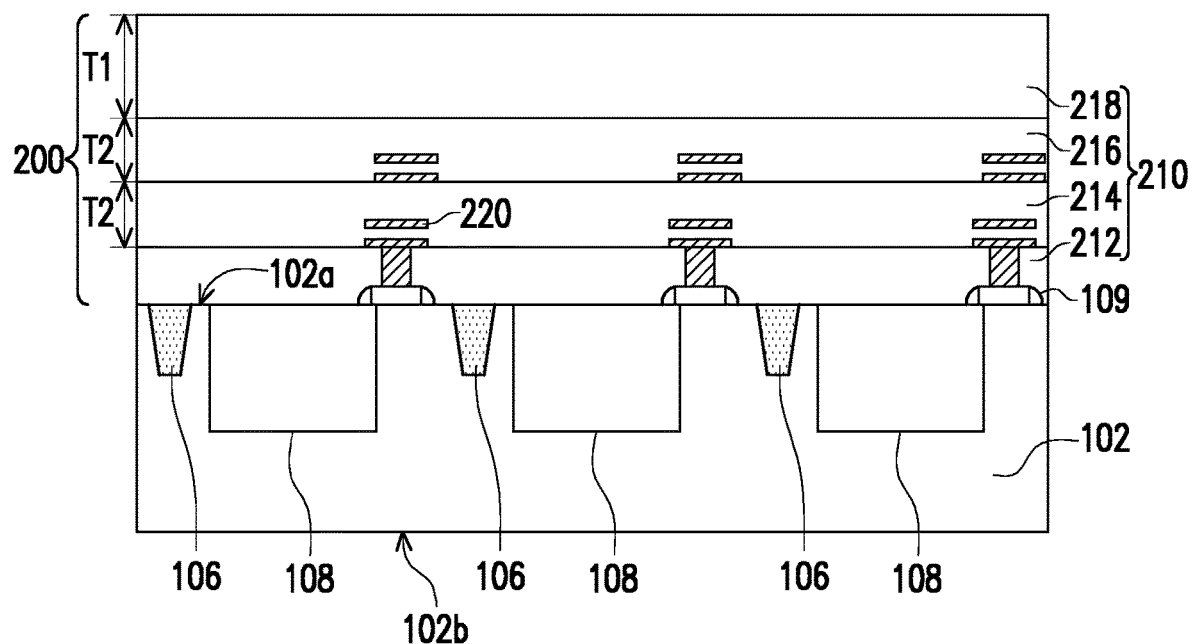

Referring to FIG. 2, an interconnection layer 200 is formed on the first surface 102a of the semiconductor substrate 102. The interconnection layer 200 interconnects the transistors 109 (and/or other transistors) and other components (e.g., an analog-to-digital converter (ADC)) such that signal generated from the photosensitive devices 108 may be transmitted to other components for processing. In some embodiment, the interconnection layer 200 includes a dielectric layer 210 and conductive wirings 220 in the dielectric layer 210. The dielectric layer 210 may include an interlayer dielectric (ILD) layer 212 and a plurality of inter-metal dielectric (IMD) layers 214, 216, 218 stacked over the semiconductor substrate 102. The ILD layer 212 is formed on the semiconductor substrate 102 to cover the photosensitive devices 108 and the transistors 109. The IMD layers 214, 216, 218 are formed over the ILD layer 212. In some embodiments, a material of the ILD layer 212 or the IMD layers 214, 216, 218 may be, for example, silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, or a combination thereof. The conductive wirings 220 are electrically coupled to devices (e.g., the transistors 109) on the first surface 102a of the semiconductor substrate 102. In some embodiments, a material of the conductive wirings 220 may be, for example, aluminum copper, copper, aluminum, some other conductive material, or a combination thereof. It should be noted that only one ILD layer and three IMD layers are shown herein. However, the disclosure is not limited thereto, and more ILD layers or IMD layers may be provided.

As shown in FIG. 2, a topmost IMD layer (i.e., the IMD layer 218) among the plurality of IMD layers 214, 216, 218 has a thickness T1, and at least one underlying IMD layer (i.e., the IMD layers 214 and/or 216) among the plurality of IMD layers 214, 216, 218 has a thickness T2. Since a subsequent process may reduce the thickness T1 of the topmost IMD layer (i.e., the IMD layer 218), in some embodiments, the thickness T1 may be greater than the thickness T2 at this stage. The details will be discussed later.

After forming the interconnection layer 200, a plurality of light pipes 250 (shown in FIG. 6) configured to direct incident radiation towards the photosensitive devices 108 are then formed in the dielectric layer 210. In some embodiments, the light pipes 250 are respectively disposed over the photosensitive devices 108. In some embodiments, the light pipes 250 are arranged in an array. The fabrication of the light pipes 250 is described in accompany with FIG. 3 through 6 in detail.

Figure 3:
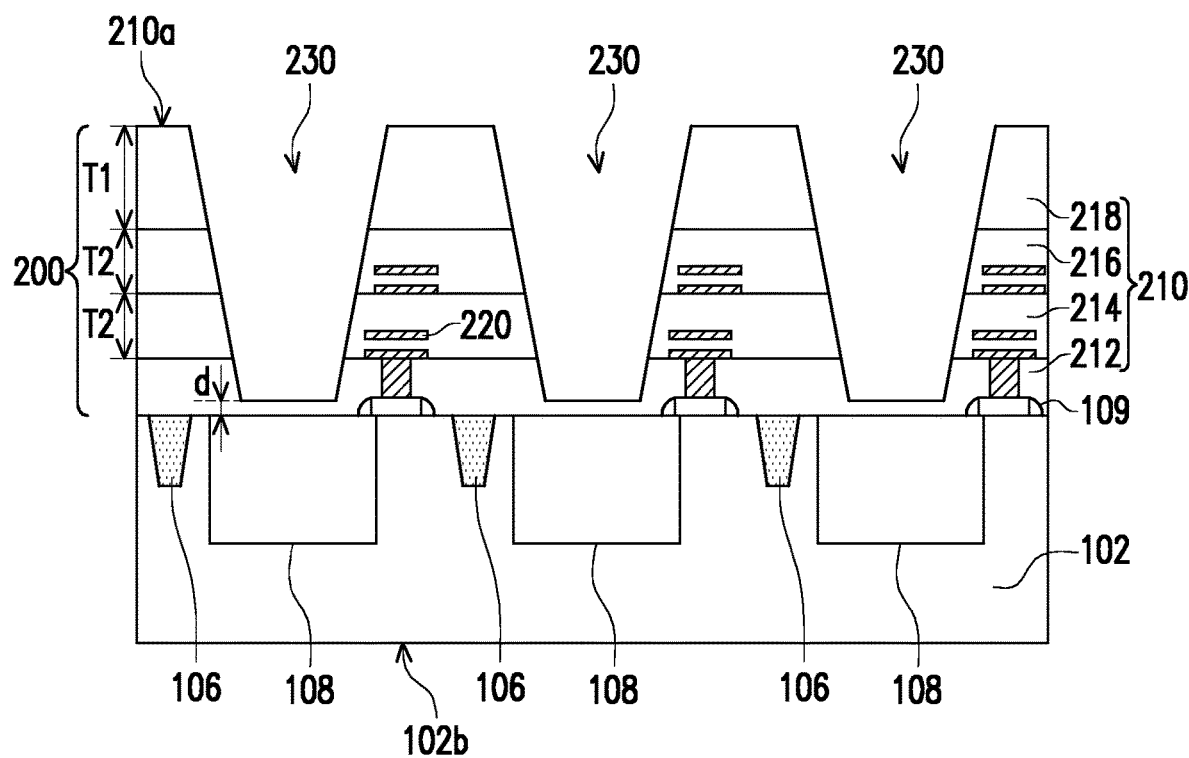

Referring to FIG. 3, trenches 230 are formed in the dielectric layer 210 and over the photosensitive devices 108 by, for example, photolithograph/etching process or other suitable patterning processes. The trenches 230 extend from a top surface 210a of the dielectric layer 210 toward the interior of the dielectric layer 210. In some embodiments, bottom surfaces of the trenches 230 keep a distance d from top surfaces of the photosensitive devices 108 to prevent the photosensitive devices 108 from damage causing by the formation process of the trenches 230 (e.g., etching process). In some embodiments, the distance d between the bottom surfaces of the trenches 230 and the top surfaces of the photosensitive devices 108 may range between about 40 nm and about 500 nm.

Figure 4:
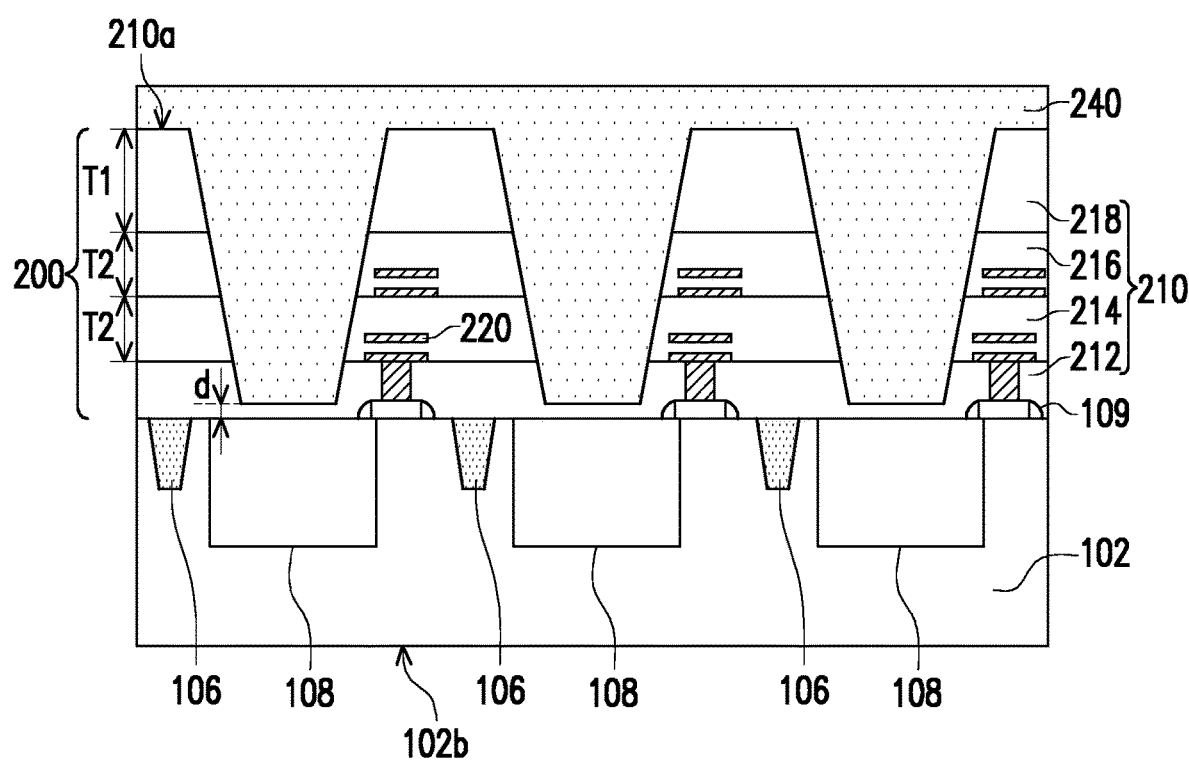

Referring to FIG. 4, a filling material 240 is formed on the dielectric layer 210 to fill the trenches 230. In some embodiments, the filling material 240 is made of a high refractive index material. In some embodiments, a refractive index of the filling material 240 is higher than a refractive index of the dielectric layer 210. In some embodiments, a material of the filling material 240 may be, for example, silicon nitride, tantalum oxide, or other suitable material. In some embodiments, the filling material 240 may entirely cover the top surface 210a of the dielectric layer 210 and entirely fill the trenches 230. As illustrated in FIG. 4, the top surface of the filling material 240 is higher than the top surface 210a of the dielectric layer 210. Furthermore, the filling material 240 may have a substantially planar top surface. For instance, a distance between the top surface 210a of the dielectric layer 210 and the top surface of the filling material 240 is greater than about 0 micrometer and/or less than about 0.3 micrometer. However, the disclosure is not limited thereto. In some embodiments, the distance between the top surface 210a of the dielectric layer 210 and the top surface of the filling material 240 is greater than about 0.3 micrometer. In one embodiment, the top surface 210a of the dielectric layer 210 and the top surface of the filling material 240 are substantially coplanar. In some other embodiments, the top surface of the filling material 240 may not substantially planar, not shown.

Figure 5:
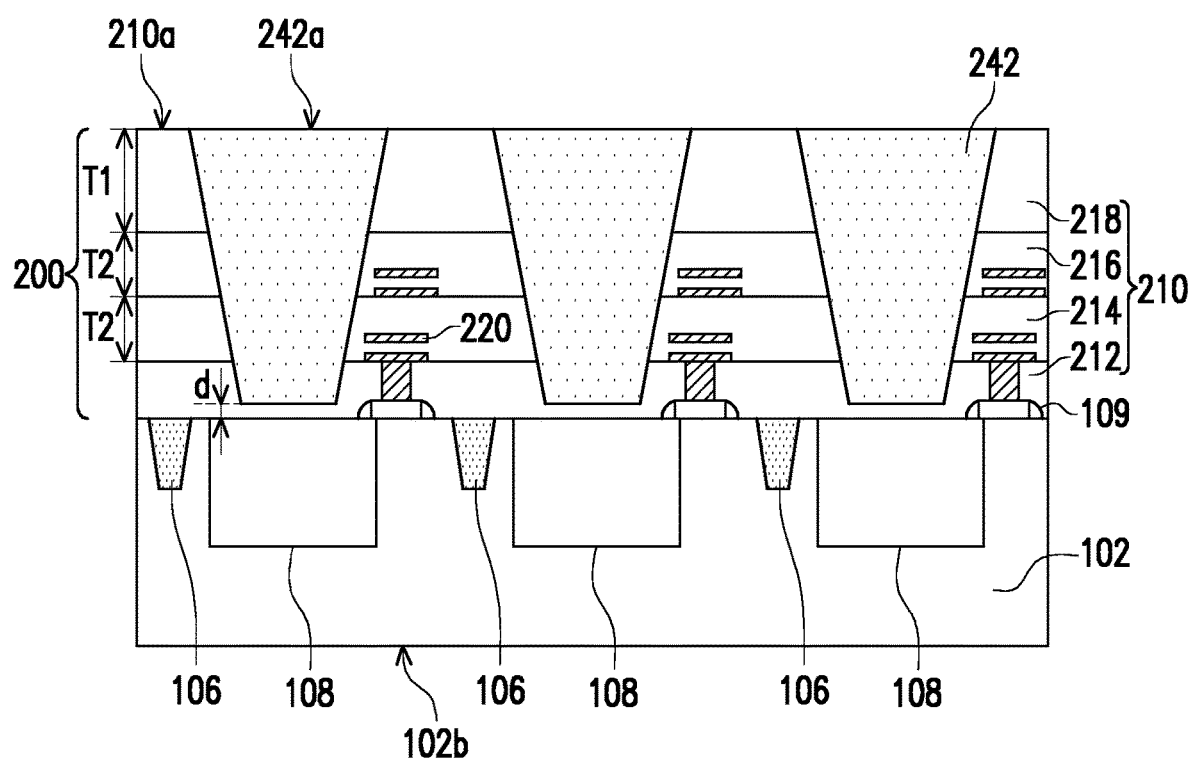
Figure 6:
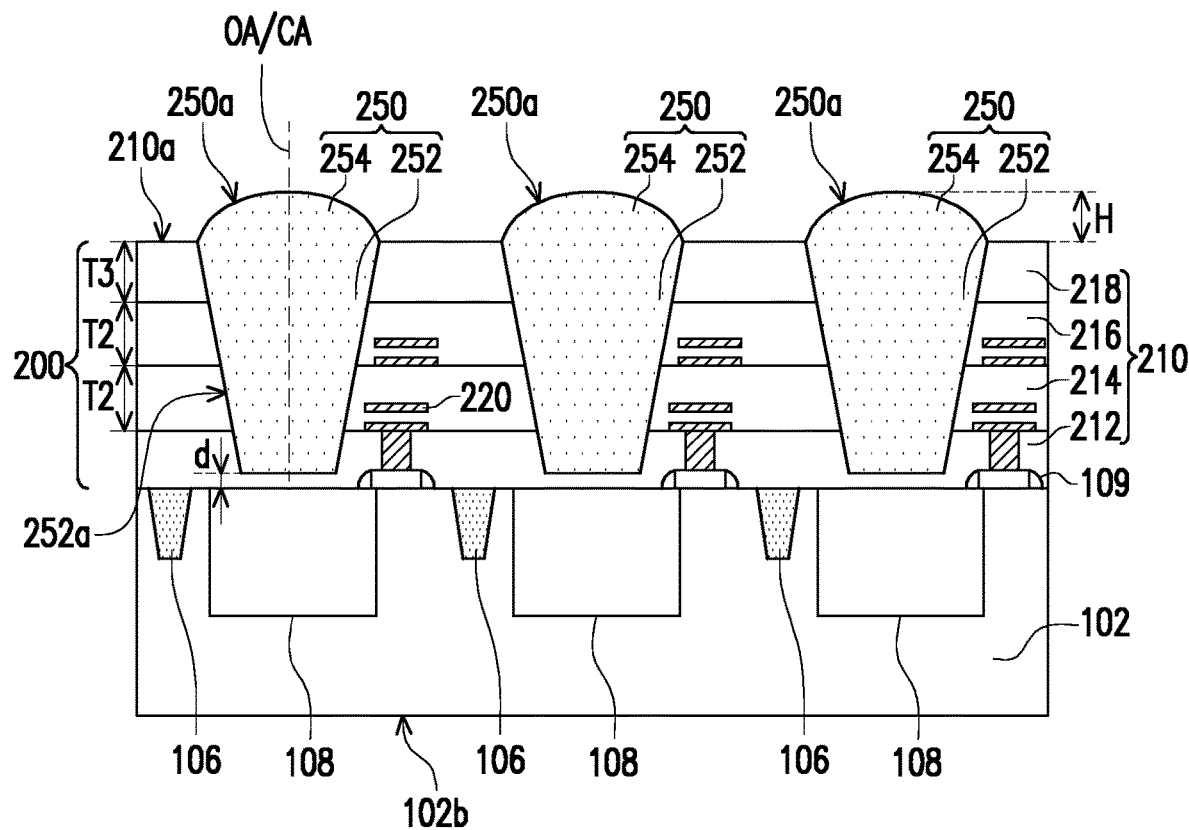

Referring to FIG. 5 and FIG. 6, the filling material 240 is polished to form the light pipes 250 (shown in FIG. 6) in the trenches 230 (illustrated in FIG. 3). Firstly, as shown in FIG. 5, the filling material 240 is polished until the top surface 210a of the dielectric layer 210 is revealed to form a polished filling material 242. In some alternative embodiments, the filling material 240 may be over-polished slightly and the thickness of the dielectric layer 210 may be reduced slightly. In some embodiments, a portion of the filling material 240 above the top surface 210a of the dielectric layer 210 is removed so as to form the polished filling material 242 in the trenches 230 (illustrated in FIG. 3), wherein a top surface 242a of the polished filling material 242 is substantially at the same level with the top surface 210a of the dielectric layer 210. In some embodiments, the filling material 240 is polished by a chemical mechanical polishing (CMP) process. Since the polished filling material 242 is formed by a chemical mechanical polishing (CMP) process, the polished filling material 242 may include polishing marks distributed on the top surface 242a thereof.

Then, as shown in FIG. 5 and FIG. 6, the polished filling material 242 and a portion of the dielectric layer 210 are further polished until the curved and convex light-incident surfaces 250a of the light pipes 250 are formed. In some embodiments, the polished filling material 242 (illustrated in FIG. 5) is polished with a first polishing rate, and the portion of the dielectric layer 210 is polished with a second polishing rate, wherein the second polishing rate is higher than the first polishing rate. In other words, at this stage, the polishing rate (removal rate) of the dielectric layer 210 is higher than the polishing rate (removal rate) of the polished filling material 242, so that the dielectric layer 210 is recessed more than the polished filling material 242, and a periphery of the top surface 242a of the polished filling material 242 may become rounded, thereby forming the curved and convex light-incident surfaces 250a of the light pipes 250. Since the light pipes 250 is formed by a chemical mechanical polishing (CMP) process, the light pipes 250 may include polishing marks distributed on the convex light-incident surfaces 250a thereof.

In some embodiments, during the above-mentioned polishing process, a portion of the IMD layer 218 is removed, so that the thickness of the IMD layer 218 is reduced. In some embodiments, after polishing the polished filling material 242 and the dielectric layer 210, the thickness T3 of the IMD layer 218 is substantially equal to the thickness T2 of at least one of the underlying IMD layers 214 and 216. Specifically, in order to make the thicknesses T3 of the IMD layer 218 substantially the same as the thickness T2 of at least one of the underlying IMD layers 214 and 216 after the polishing process, an initial thickness (i.e., thickness T1) of the IMD layer 218 may be greater than an originally-designed thickness of an IMD layer before the polishing process. Therefore, when the light pipes 250 are formed, the thickness T3 of the IMD layer 218 may be reduced to the originally-designed thickness (e.g., thickness T2) of an IMD layer. However, in some alternative embodiments, the thickness T3 of the IMD layer 218 may be less than the thickness T2 of at least one of the underlying IMD layers 214 and 216. In some alternative embodiments, the thickness T3 of the IMD layer 218 may be greater than the thickness T2 of at least one of the underlying IMD layers 214 and 216.

As shown in FIG. 6, the light pipes 250 are formed over the photosensitive devices 108 and embedded in the dielectric layer 210. In some embodiments, the light pipes 250 extend into the dielectric layer 210 of the interconnection layer 200, and the light pipes 250 and the photosensitive device 108 are spaced apart by a portion of the dielectric layer 210. In some embodiments, the light pipes 250 are between adjacent conductive wirings 220 of the interconnection layer 200. In some embodiments, each of the light pipes 250 includes a light-guiding portion 252 embedded in the dielectric layer 210 and a lens portion 254 protruding upwardly from the light-guiding portion 252, the light-guiding portion 252 is between the lens portion 254 and the photosensitive device 108, and the lens portion 254 includes the curved and convex light-incident surface 250a. In some embodiments, a height H of the lens portion 254 may range between about 10 nm and about 500 nm. In some embodiments, the light-guiding portions 252 of light pipes 250 may have tapered sidewalls 252a, and the width of the light-guiding portions 252 is gradually decreased form a side close to the lens portions 254 to a side close to the photosensitive devices 108. However, in some alternative embodiments, the light-guiding portions 252 may have vertical sidewalls.

Since the light-guiding portion 252 and the lens portion 254 are integrally formed and made of the same material, the lens portion 254 is seamlessly connected to the light-guiding portion 252. In other words, there is no interface between the light-guiding portion 252 and the lens portion 254. In some embodiments, an optical axis OA of the lens portion 254 is substantially aligned with a center of the light-guiding portion 252. That is to say, the lens portion 254 and the light-guiding portion 252 share a same central axis CA. Therefore, a light collection may be improved, so as to enhance the quantum efficiency. In addition, in some embodiments, the central axis CA of one light pipe 250 may be substantially aligned with a center of one photosensitive device 108.

In some embodiments, the refractive index of the light pipe 250 is higher than the refractive index of the dielectric layer 210, and the incident radiation may be totally internally reflected at the sidewalls 252a of the light-guiding portions 252, so as to guide incident radiation to the photosensitive device 108. In some embodiments, the refractive index of the light pipe 250 may range between about 1.9 and about 2.0. In some embodiments, the refractive index of the dielectric layer 210 may be about 1.4. Besides, the lens portions 254 of the light pipes 250 have the curved and convex light-incident surfaces 250a to converge the incident radiation. Therefore, the light pipe 250 having the light-guiding portion 252 and the lens portion 254 may enhance the radiation received by the photosensitive device 108.

Figure 7:
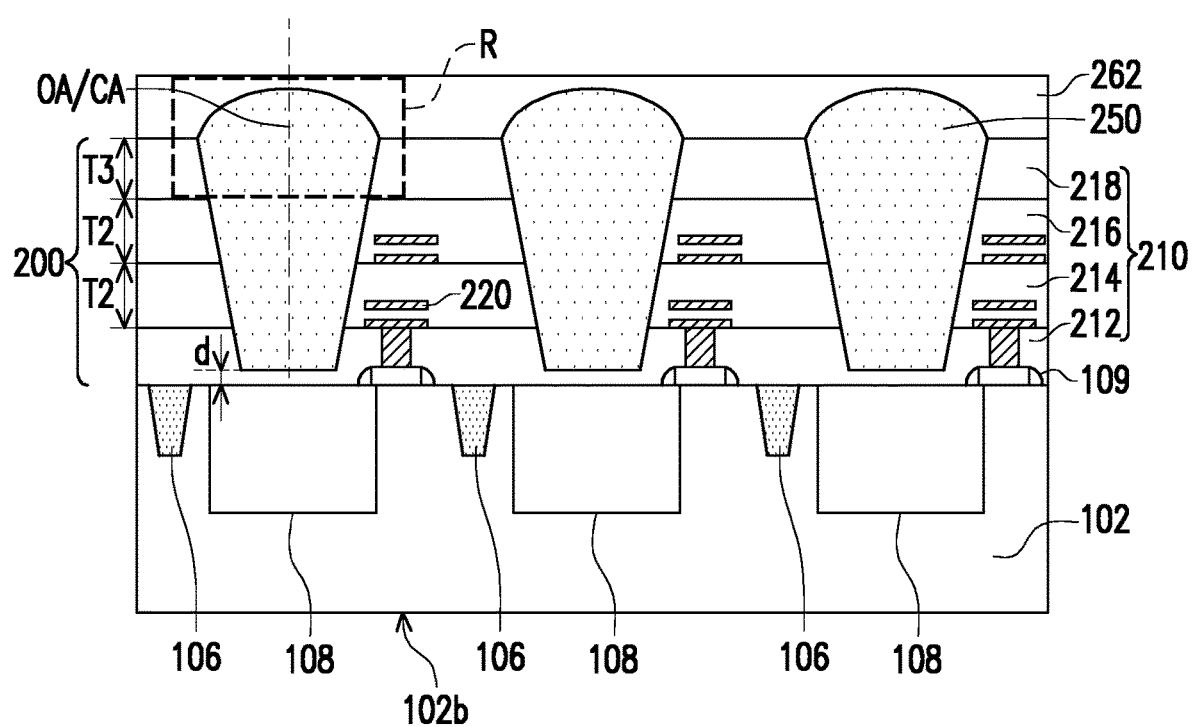

Referring to FIG. 7, a planarization layer 262 is formed on the semiconductor substrate 102 to cover the interconnection layer 200 and the light pipes 250. In some embodiments, the planarization layer 262 may be formed by depositing a dielectric material on the interconnection layer 200 and the light pipes 250 and then optionally planarizing the dielectric material. In some embodiments, the planarization layer 262 may protect the lens portions 254 of the light pipes 250 and provide a planar surface for the overlying layers.

Figure 15A:
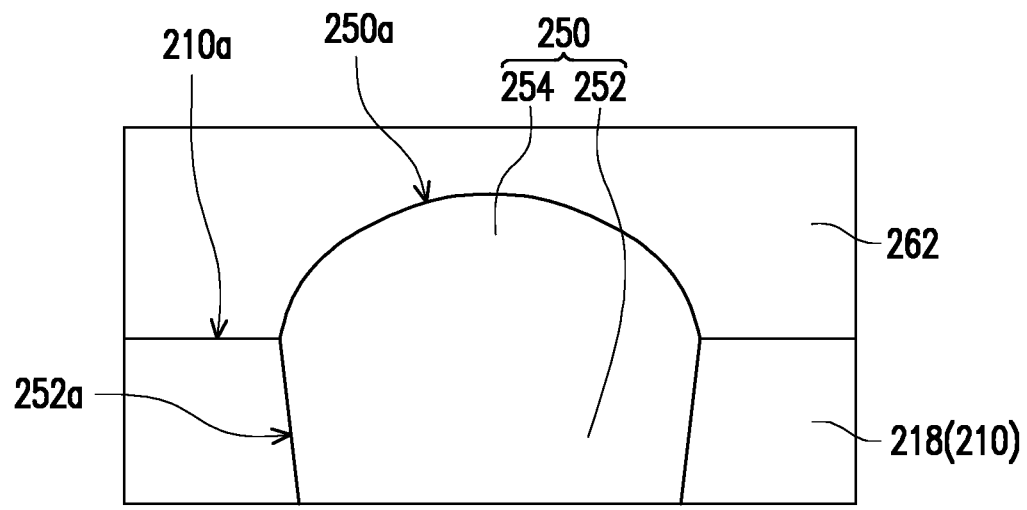
FIGS. 15A through 15D are enlarged views of the region R illustrated in FIG. 7 or FIG. 14 in accordance with various embodiments of the present disclosure.
Figure 15B:
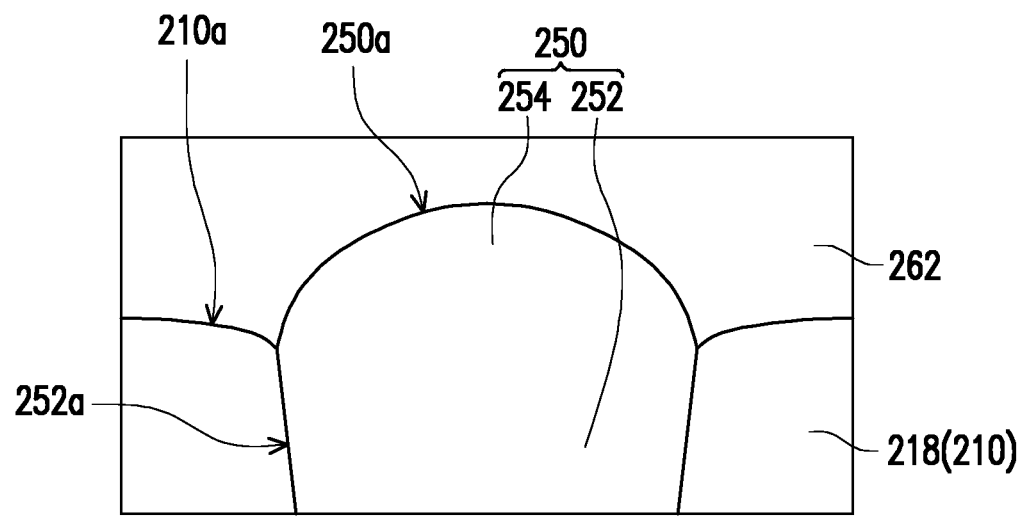
Figure 15C:
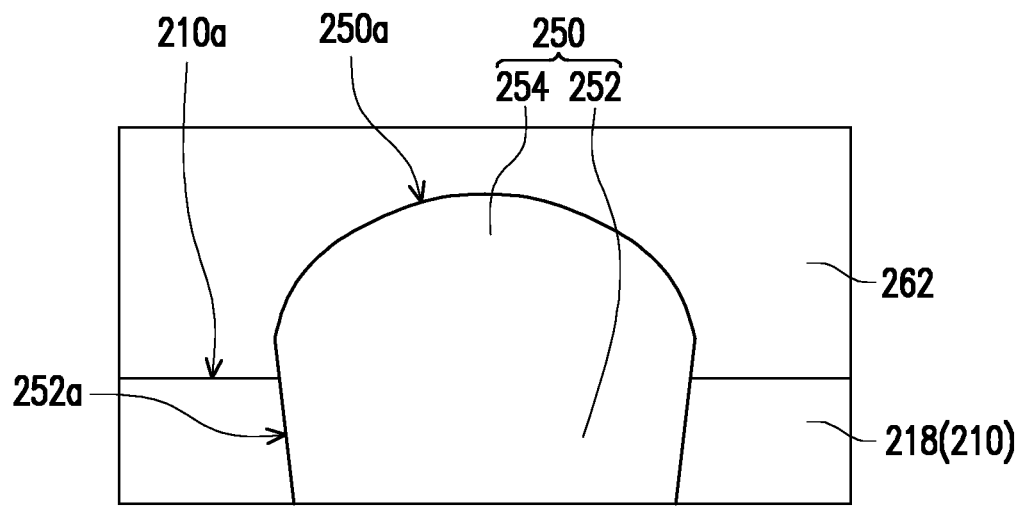

FIGS. 15A through 15D are enlarged views of the region R illustrated in FIG. 7 in accordance with various embodiments of the present disclosure. In some embodiments, as shown in FIG. 15A to FIG. 15C, a maximum width of the lens portion 254 may be substantially equal to that of the light-guiding portion 252, and the lens portion 254 may entirely cover the light-guiding portion 252. In FIG. 15A and FIG. 15B, the sidewall 252a of the light-guiding portion 252 may be in contact with the dielectric layer 210, and the curved and convex light-incident surfaces 250a may be in contact with and covered by the planarization layer 262. In FIG. 15A and FIG. 15C, the top surface 210a of the dielectric layer 210 is substantially planar. In FIG. 15B, a portion of the top surface 210a of the dielectric layer 210 in proximity to the light pipe 250 is curved and concaved. In FIG. 15C, a sidewall 252a of the light-guiding portion 252 may be in contact with the dielectric layer 210 and the planarization layer 262, and the curved and convex light-incident surfaces 250a may be in contact with the planarization layer 262. In other words, after the light pipe 250 is formed, an upper portion of the light-guiding portion 252 may protrude beyond the top surface 210a of the dielectric layer 210 and in contact with the planarization layer 262. Furthermore, an upper portion of the sidewalls 252a of the light-guiding portion 252 is covered by and in contact with the planarization layer 262.

Figure 15D:
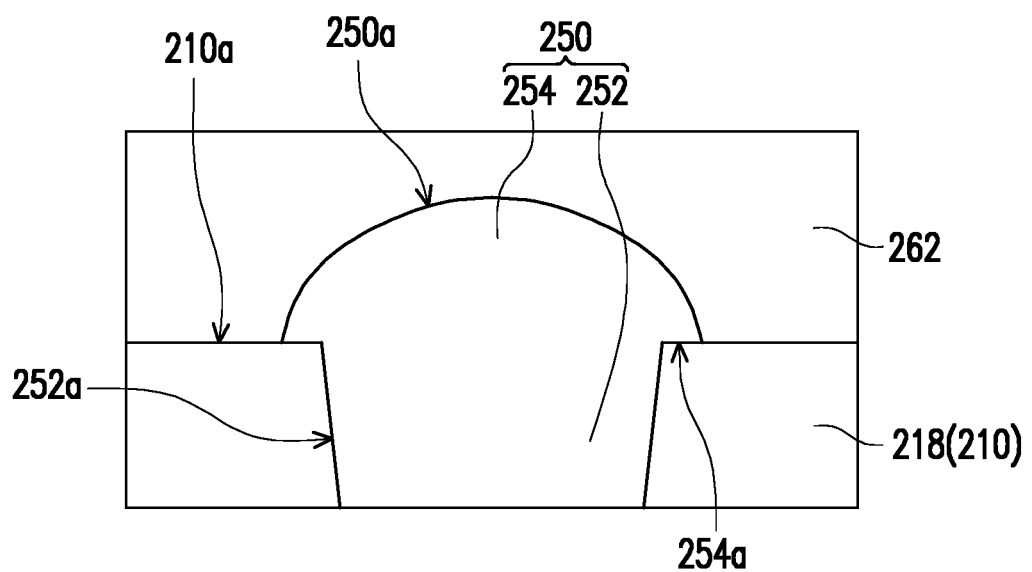

In some alternative embodiments, as shown in FIG. 15D, the lens portion 254 may be wider than the light-guiding portion 252, and the lens portion 254 may not only entirely cover the light-guiding portion 252, but also cover a portion of the top surface 210a of the dielectric layer 210. In other words, the dielectric layer 210 is partially covered by the lens portion 254. For example, the bottom dimension of the lens portion 254 may be wider than the top dimension of the light-guiding portion 252, and the lens portion 254 may entirely cover the light-guiding portion 252 and partially cover a portion of the top surface 210a of the dielectric layer 210. In FIG. 15D, a sidewall 252a of the light-guiding portion 252 may be in contact with the dielectric layer 210, the curved and convex light-incident surfaces 250a may be in contact with the planarization layer 262, and a bottom surface 254a (e.g., a ring shaped bottom surface) of the lens portion 254 is in contact with a portion of the top surface 210a of the dielectric layer 210, wherein the bottom surface 254a of the lens portion 254 is connected between the curved and convex light-incident surfaces 250a of the lens portion 254 and the sidewall 252a of the light-guiding portion 252.

Figure 8:
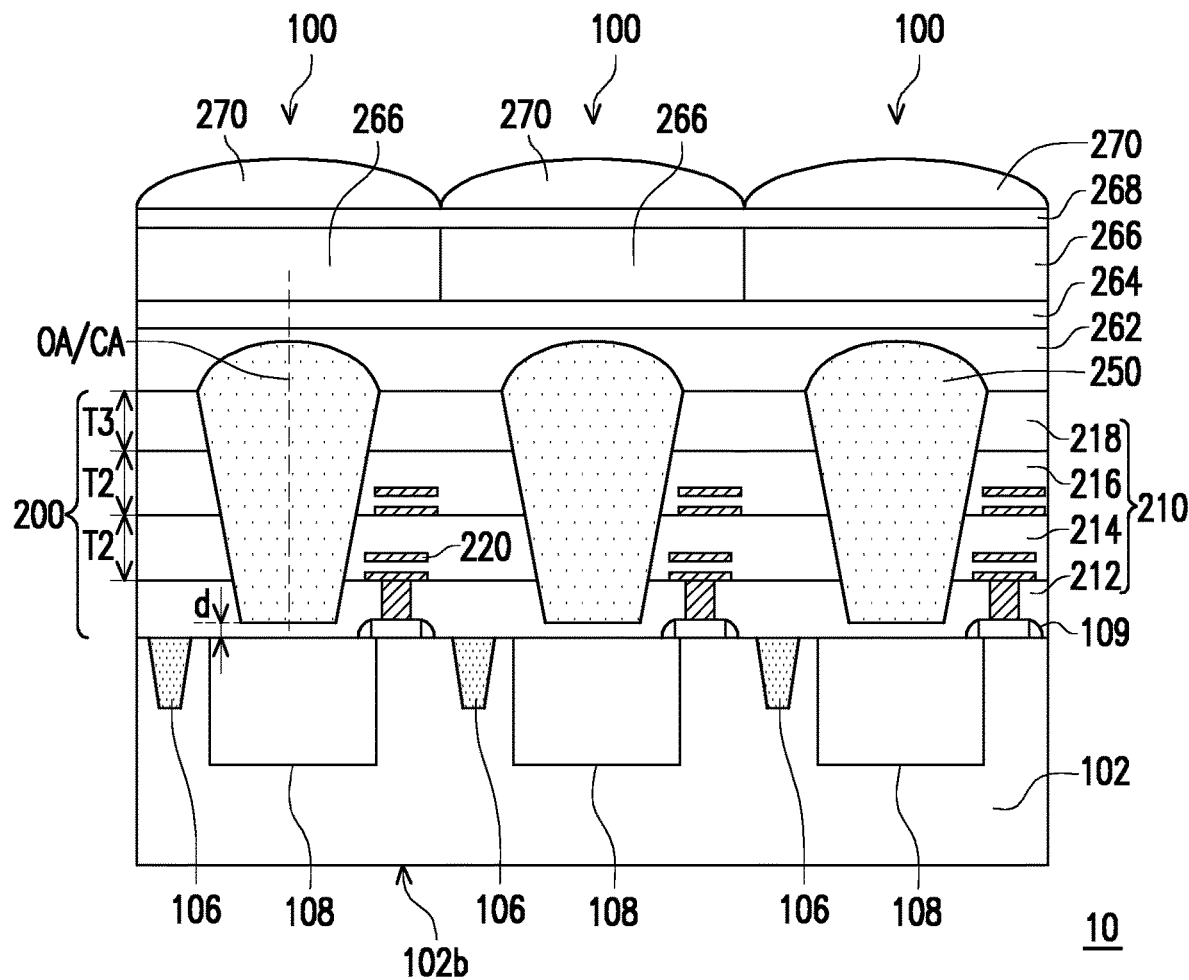

Referring to FIG. 8, a passivation layer 264 and a plurality of color filters 266 (e.g., a red color filter, a blue color filter, a green color filter, etc.) may be formed on the planarization layer 262. In some embodiments, the color filters 262 are respectively disposed over the light pipes 250. In some embodiments, the color filters 266 are arranged in an array over the passivation layer 264. The color filters 266 are respectively configured to transmit specific wavelengths of incident radiation, while blocking other wavelengths of incident radiation. For example, a color filter may be configured to pass red wavelengths of radiation, while blocking blue wavelengths of incident radiation, whereas another color filter may be configured to pass blue wavelengths of radiation, while blocking red wavelengths of incident radiation.

Further, a planarization layer 268 and a plurality of micro-lenses 270 may be formed on the color filters 262. In some embodiments, the micro-lenses 270 are respectively disposed over the color filters 262. The micro-lenses 270 are configured to focus incident radiation (e.g., photons) towards the light pipes 250. Each of the micro-lenses 270 includes a convex shaped upper surface which facilitates the convergence of the incident radiation. The micro-lenses 270 may be fabricated by materials such as silicon dioxide or a resin material on intermediate transparent film. In some embodiments, the central axis CA of one light pipe 250 may be substantially aligned with an optical axis of one micro-lens 270.

In some embodiments, after the micro-lenses 270 are formed, the fabrication process of the image sensor 10 is completed. The image sensor 10 may be, for example, front-side illuminated (FSI). In some embodiments, the image sensor 10 includes a plurality of photo-sensing devices 100, and each of the photo-sensing devices 100 includes one of the photosensitive devices 108, one of the light pipes 250, one of the color filters 266 and one of the micro-lenses 270. In some embodiments, the photo-sensing devices 100 may be, for example, pixel sensors.

Since the light pipe 250 has the curved and convex light-incident surfaces 250a to converge the incident radiation, there is no need to further form extra inner lenses between the light pipes 250 and the micro-lenses 270. Besides, another planarization layer formed on the extra inner lenses may be omitted. Accordingly, the image sensor 10 including the light pipes 250 integrated with the lens portions 254 may have a simplified process, which facilitates to reduce cost and improve yield.

Figure 9:
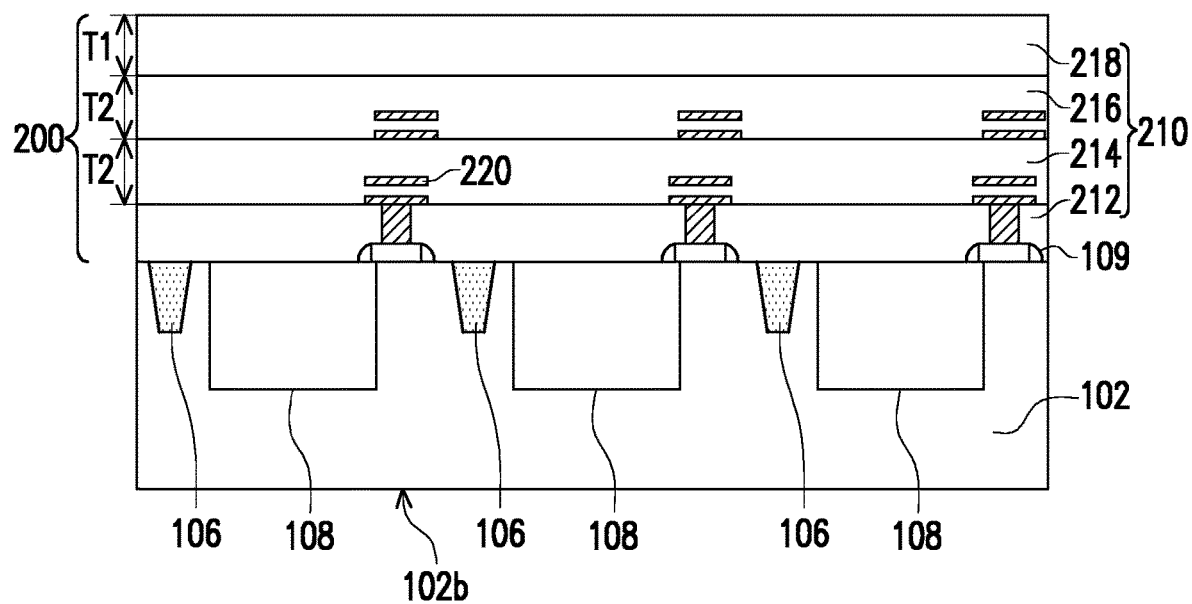
FIG. 9 to FIG. 14 are schematic cross-sectional views illustrating various stages in a manufacturing method of an image sensor according to some embodiments of the present disclosure.

FIG. 9 to FIG. 14 are schematic cross-sectional views illustrating various stages in a manufacturing method of an image sensor according to some embodiments of the present disclosure. Referring to FIG. 9, the device shown in FIG. 9 is similar to the device shown in FIG. 2. Thus, detailed descriptions thereof are omitted here. A difference therebetween lies in that the thickness T1 of the IMD 218 is substantially equal to the thickness T2 of the at least one of the underlying IMD layers 214 and 216 since the light pipes 250 illustrated in the present embodiment is formed by a patterning process and a curing process instead of the polishing process. However, in some alternative embodiments, the thickness T1 of the IMD layer 218 may be less than the thickness T2 of at least one of the underlying IMD layers 214 and 216. In some alternative embodiments, the thickness T1 of the IMD layer 218 may be greater than the thickness T2 of at least one of the underlying IMD layers 214 and 216.

Figure 10:
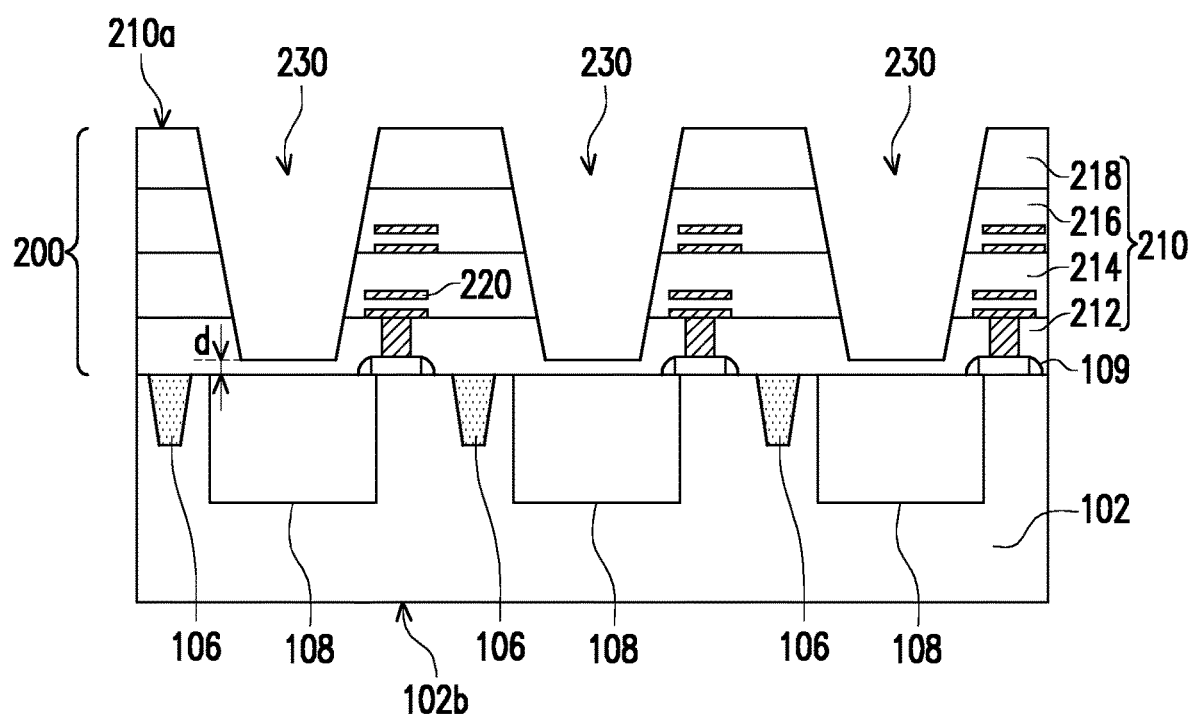

Referring to FIG. 10, trenches 230 are formed in the dielectric layer 210 and over the photosensitive devices 108 by, for example, photolithograph/etching process or other suitable patterning processes. The trenches 230 extend from a top surface 210a of the dielectric layer 210 toward the interior of the dielectric layer 210. In some embodiments, bottom surfaces of the trenches 230 keep a distance d from top surfaces of the photosensitive devices 108 to prevent the photosensitive devices 108 from damage causing by the formation process of the trenches 230 (e.g., etching process). In some embodiments, the distance d between the bottom surfaces of the trenches 230 and the top surfaces of the photosensitive devices 108 may range between about 40 nm and about 500 nm.

Figure 11:
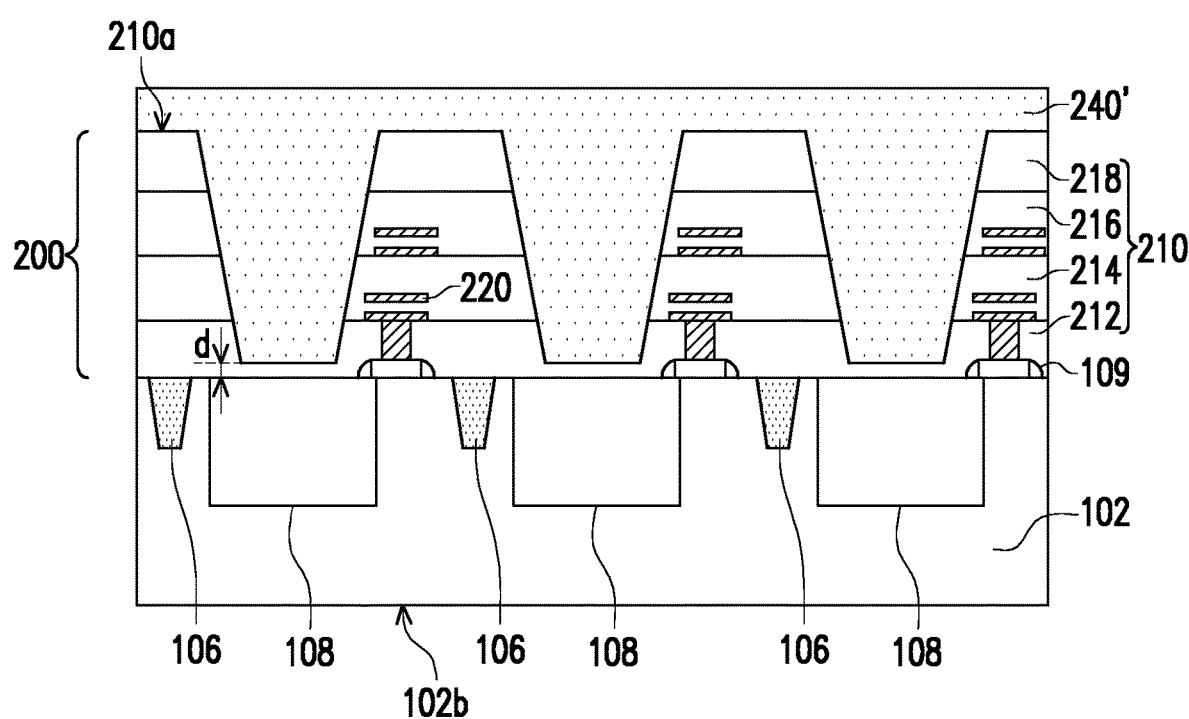

Referring to FIG. 11, a filling material 240' is formed on the dielectric layer 210 to fill the trenches 230. In some embodiments, the filling material 240' is made of a high refractive index material. In some embodiments, a refractive index of the filling material 240' is higher than a refractive index of the dielectric layer 210. The filling material 240' may include a photosensitive material, for example, polybenzoxazole (PBO), polyimide, benzocyclobutene (BCB) or the like, that may be patterned using a lithography mask. In some embodiments, the filling material 240' may entirely cover the top surface 210a of the dielectric layer 210 and entirely fill the trenches 230. As illustrated in FIG. 11, the top surface of the filling material 240' is higher than the top surface 210a of the dielectric layer 210. Furthermore, the filling material 240' may have a substantially planar top surface. For instance, a distance between the top surface 210a of the dielectric layer 210 and the top surface of the filling material 240' ranges from about 0.05 micrometer to about 1 micrometer. In some other embodiments, the top surface of the filling material 240' may not substantially planar, not shown.

Figure 12:
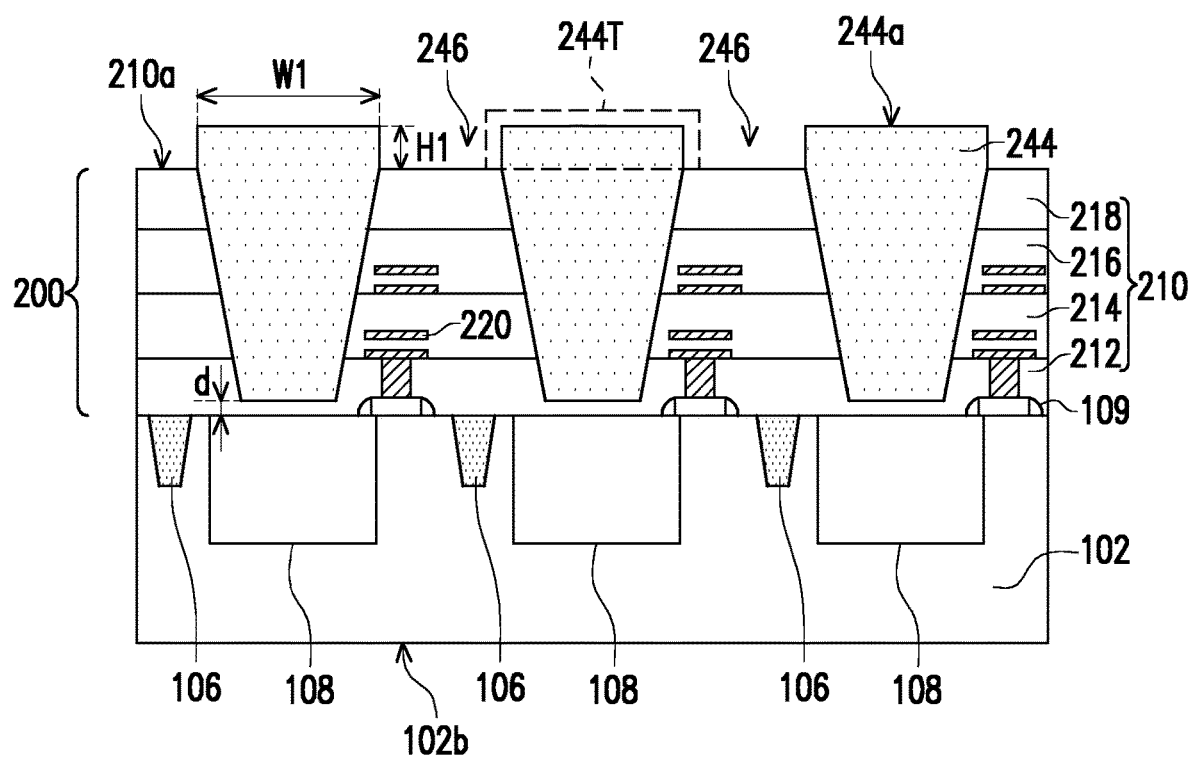

Referring to FIG. 11 and FIG. 12, the filling material 240' is patterned to form a patterned filling material 244. In some embodiments, the filling material 240' may be made of a photosensitive material, and the filling material 240' may be patterned by a photolithography process. The patterning process may be performed by exposing the filling material 240' to light and developing the filling material 240' after the exposure. After the patterning process, spacing 246 is formed and the top surface 210a of the dielectric layer 210 is partially exposed.

Figure 13:
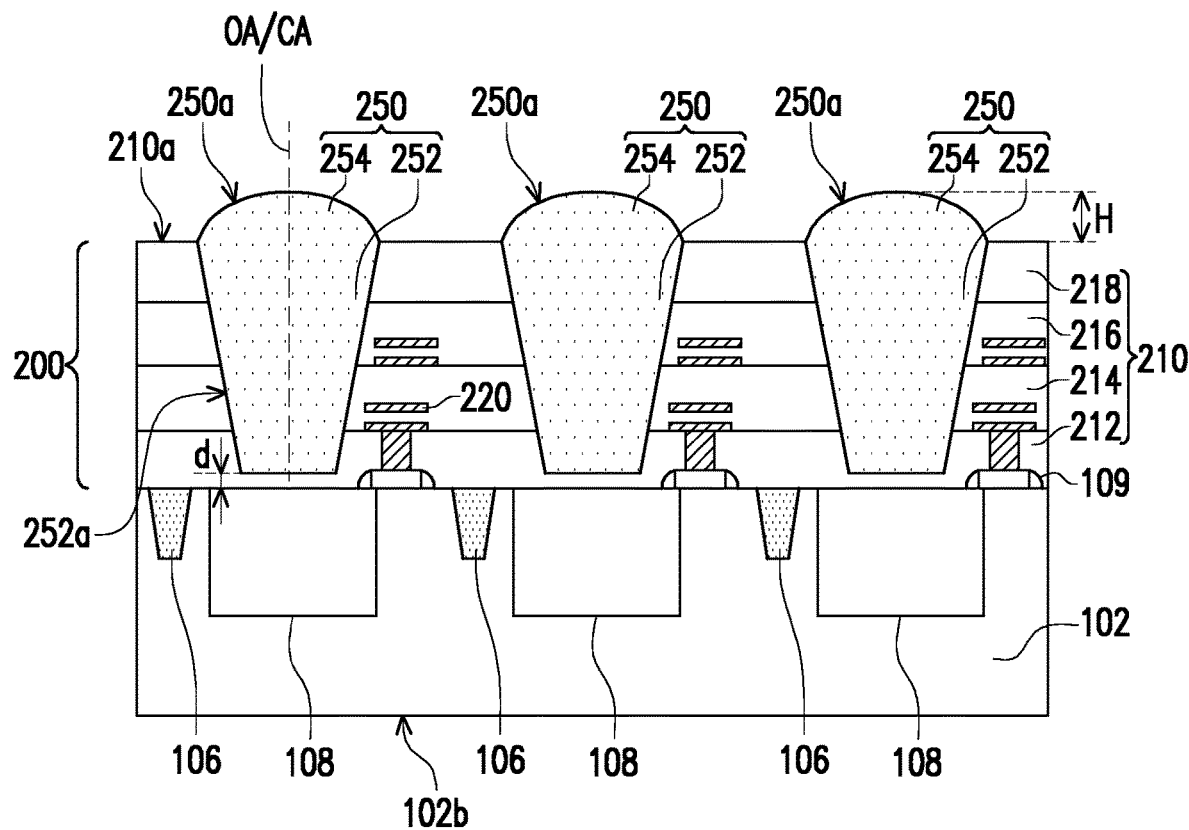

Referring to FIG. 12 and FIG. 13, the patterned filling material 244 are then reflowed and cured to form the light pipes 250. In some embodiments, a reflowing process is performed to re-shape the top profile of the patterned filling material 244, and a curing process is then performed to solidify the reflowed patterned filling material 244. After performing the above-mentioned reflowing and curing processes, a periphery of a top surface 244a of the patterned filling material 244 may become rounded, thereby forming the curved and convex light-incident surfaces 250a of the light pipes 250. In some embodiments, a top portion 244T of the patterned filling material 244 above the top surface 210a of the dielectric layer 210 may have a width W1 and a height H1, which may be specially designed to achieve specific curvature of the curved and convex light-incident surfaces 250a of the light pipes 250. In some embodiments, the width W1 of the top portion 244T of the patterned filling material 244 may range between about 300 nm and about 5000 nm. In some embodiments, the height H1 of the top portion 244T of the patterned filling material 244 may range between about 50 nm and about 900 nm.

As shown in FIG. 13, the light pipes 250 are formed over the photosensitive devices 108 and embedded in the dielectric layer 210. In some embodiments, the light pipes 250 extend into the dielectric layer 210 of the interconnection layer 200, and the light pipes 250 and the photosensitive device 108 are spaced apart by a portion of the dielectric layer 210. In some embodiments, the light pipes 250 are between adjacent conductive wirings 220 of the interconnection layer 200. In some embodiments, each of the light pipes 250 includes a light-guiding portion 252 embedded in the dielectric layer 210 and a lens portion 254 protruding upwardly from the light-guiding portion 252, the light-guiding portion 252 is between the lens portion 254 and the photosensitive device 108, and the lens portion 254 includes the curved and convex light-incident surface 250a. In some embodiments, a height H of the lens portion 254 may range between about 50 nm and about 1000 nm. For example, the height H of the lens portion 254 is greater than the height H1 of the top portion 244T of the patterned filling material 244 (shown in FIG. 12). In some embodiments, the light-guiding portions 252 of light pipes 250 may have tapered sidewalls 252a, and the width of the light-guiding portions 252 is gradually decreased form a side close to the lens portions 254 to a side close to the photosensitive devices 108. However, in some alternative embodiments, the light-guiding portions 252 may have vertical sidewalls.

Since the light-guiding portion 252 and the lens portion 254 are integrally formed and made of the same material, the lens portion 254 is seamlessly connected to the light-guiding portion 252. In other words, there is no interface between the light-guiding portion 252 and the lens portion 254. In some embodiments, an optical axis OA of the lens portion 254 is substantially aligned with a center of the light-guiding portion 252. That is to say, the lens portion 254 and the light-guiding portion 252 share a same central axis CA. Therefore, a light collection may be improved, so as to enhance the quantum efficiency. In addition, in some embodiments, the central axis CA of one light pipe 250 may be substantially aligned with a center of one photosensitive device 108.

In some embodiments, the refractive index of the light pipe 250 is higher than the refractive index of the dielectric layer 210, and the incident radiation may be totally internally reflected at the sidewalls 252a of the light-guiding portions 252, so as to guide incident radiation to the photosensitive device 108. In some embodiments, the refractive index of the light pipe 250 may range between about 1.9 and about 2.0. In some embodiments, the refractive index of the dielectric layer 210 may be about 1.4. Besides, the lens portions 254 of the light pipes 250 have the curved and convex light-incident surfaces 250a to converge the incident radiation. Therefore, the light pipe 250 having the light-guiding portion 252 and the lens portion 254 may enhance the radiation received by the photosensitive device 108.

Figure 14:
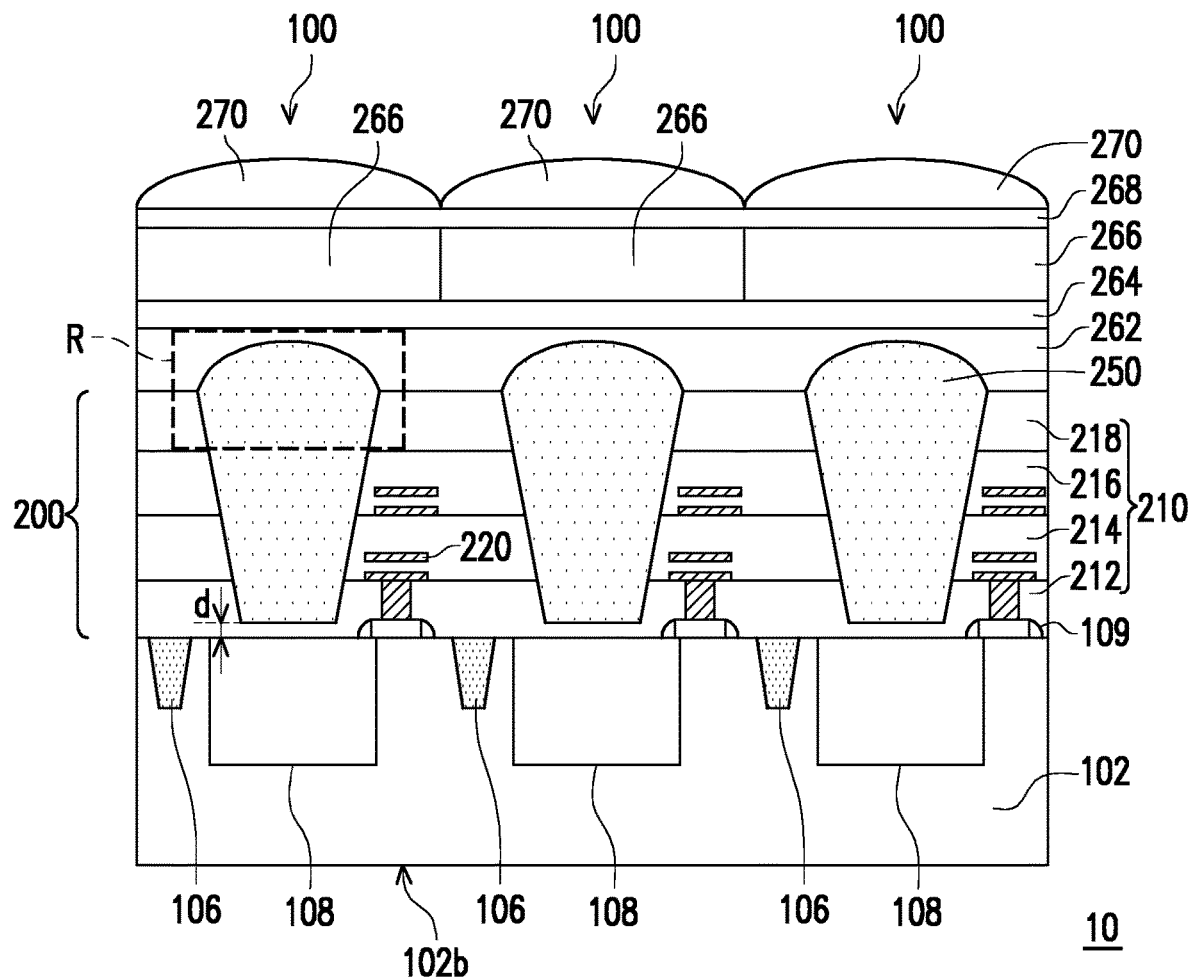

Referring to FIG. 14, a planarization layer 262, a passivation layer 264, a plurality of color filters 266, a planarization layer 268 and a plurality of micro-lenses 270 may be formed. The planarization layer 262, the passivation layer 264, the plurality of color filters 266, the planarization layer 268 and the plurality of micro-lenses 270 shown in FIG. 14 are similar to the planarization layer 262, the passivation layer 264, the plurality of color filters 266, the planarization layer 268 and the plurality of micro-lenses 270 shown in FIG. 8, and detailed descriptions thereof are omitted here. Besides, enlarged views of the region R in FIG. 14 is also shown in FIG. 15A to FIG. 15D, and detailed descriptions thereof are not repeated herein.

Since the light pipe 250 has the curved and convex light-incident surfaces 250a to converge the incident radiation, there is no need to further form extra inner lenses between the light pipes 250 and the micro-lenses 270. Besides, another planarization layer formed on the extra inner lenses may be omitted. Accordingly, the image sensor 10 including the light pipes 250 integrated with the lens portions 254 may have a simplified process, which facilitates to reduce cost and improve yield.

In accordance with some embodiments of the disclosure, a photo-sensing device includes a semiconductor substrate, a photosensitive device, a dielectric layer and a light pipe. The photosensitive device is in the semiconductor substrate. The dielectric layer is over the semiconductor substrate. The light pipe is over the photosensitive device and embedded in the dielectric layer. The light pipe includes a curved and convex light-incident surface.

In accordance with some embodiments of the disclosure, a method of manufacturing a photo-sensing device includes at least the following steps. A semiconductor substrate including a photosensitive device formed therein is provided. A dielectric layer is formed over the semiconductor substrate. A trench is formed in the dielectric layer. A filling material is formed on the dielectric layer to fill the trench. The filling material and the dielectric layer are polished to form a light pipe in the trench, wherein the light pipe includes a curved and convex light-incident surface.

In accordance with some alternative embodiments of the disclosure, a method of manufacturing a photo-sensing device includes at least the following steps. A semiconductor substrate is provided. A photosensitive device is formed in the semiconductor substrate. A dielectric layer is formed over the semiconductor substrate. A trench is formed in the dielectric layer. A filling material is formed on the dielectric layer to fill the trench. The filling material is patterned to form a patterned filling material. The patterned filling material is cured to form a light pipe in the trench, wherein the light pipe includes a lens portion having a curved and convex light-incident surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a trench in a dielectric layer;
   forming a filling material over the dielectric layer to fill the trench;
   removing a portion of the filling material to form a remaining portion of the filling material in the trench until a top surface of the dielectric layer is revealed, wherein a top surface of the remaining portion of the filling material levels with the top surface of the dielectric layer; and
   polishing the dielectric layer and the remaining portion of the filling material to form a light pipe having a curved and convex surface, wherein the dielectric layer is recessed more than the remaining portion of the filling material during the polishing of the dielectric layer and the remaining portion such that the top surface of the dielectric layer is lowered to a first level height and a top of the curved and convex surface is located at a second level height higher than the first level height after polishing the dielectric layer and the remaining portion of the filling material.

2. The method according to claim 1, wherein a thickness reduction of the dielectric layer is greater than a minimum thickness reduction of the remaining portion of the filling material during the polishing of the dielectric layer and the remaining portion.

3. The method according to claim 1, wherein the dielectric layer comprises stacked inter-metal dielectric layers, a topmost inter-metal dielectric layer among the stacked inter-metal dielectric layers has a first thickness, at least one underlying inter-metal dielectric layer among the stacked inter-metal dielectric layers has a second thickness, and the first thickness is greater than the second thickness before polishing the portion of the dielectric layer and the remaining portion of the filling material.

4. The method according to claim 3, wherein the topmost inter-metal dielectric layer is partially polished after polishing the portion of the dielectric layer and the remaining portion of the filling material.

5. The method according to claim 3, wherein the thickness of the topmost inter-metal dielectric layer is equal to that of the at least one underlying inter-metal dielectric layer after polishing the portion of the dielectric layer and the remaining portion of the filling material.

6. The method according to claim 1, wherein a refractive index of the filling material is higher than a refractive index of the dielectric layer.

7. A method, comprising:
   forming a trench in dielectric layers;
   forming a filling material covering the dielectric layers and filling the trench; and
   performing a first polishing process to remove a portion of the filling material until a topmost dielectric layer among the dielectric layers is revealed and a remaining filling material is formed in the trench, wherein a top surface of the remaining filling material levels with a top surface of the topmost dielectric layer; and
   after the dielectric layer is revealed, performing a second polishing process to lower the top surface of the topmost dielectric layer as well as to remove a portion of the remaining filling material such that a light pipe is formed, wherein the topmost dielectric layer is recessed more than the remaining filling material during the second polishing process such that the top surface of the topmost dielectric layer is lowered to a first level height and a top of the light pipe is located at a second level height higher than the first level height after performing the second polishing.

8. The method according to claim 7, wherein a thickness reduction the topmost dielectric layer is greater than a minimum thickness reduction of the remaining filling material during the second polishing process.

9. The method according to claim 7 further comprising:
   forming a planarization layer covering the light pipe after performing the second polishing process, wherein the first polishing process removes the portion of the filling material until the topmost dielectric layer is revealed; and
   the second polishing process removes the portion of the remaining filling material and a portion of the topmost dielectric layer to form the light pipe having a rounded light-incident surface, wherein the light pipe comprises a light-guiding portion and a lens portion on the light-guiding portion, the light-guiding portion has a bottom width and a top width greater than the bottom width, a lateral dimension of the lens portion is greater than the bottom width of the light-guiding portion process, and a sidewall of the light-guiding portion of the light pipe is revealed after performing the second polishing process and before forming the planarization layer.

10. The method according to claim 9, wherein the portion of the filling material is polished with a first polishing rate, the portion of the topmost dielectric layer is polished with a second polishing rate, and the second polishing rate is higher than the first polishing rate.

11. The method according to claim 9, wherein the topmost dielectric layer among the dielectric layers has a first thickness before performing the second polishing process.

12. The method according to claim 11, wherein at least one underlying dielectric layer among the dielectric layers has a second thickness, and the first thickness is greater than the second thickness before performing the second polishing process.

13. The method according to claim 11, wherein the light pipe protrudes from a top surface of the topmost dielectric layer among the dielectric layers after performing the second polishing process.

14. The method according to claim 11, wherein the thickness of the topmost dielectric layer among the dielectric layers is equal to that of the at least one underlying dielectric layer among the dielectric layers after performing the second polishing process.

15. The method according to claim 9, wherein the rounded light-incident surface comprises a curved and convex light-incident surface.

16. The method according to claim 9, wherein the sidewall of the light-guiding portion is in contact with the planarization layer and the dielectric layers.

17. A method, comprising:

forming a filling material covering a dielectric layer and filling a trench in the dielectric layer;

performing a first polishing process to remove a portion of the filling material until the dielectric layer is revealed and a remaining filling material is formed in the trench, wherein a top surface of the remaining filling material levels with a top surface of the dielectric layer; and performing a second polishing process to lower the top surface of the dielectric layer as well as remove a portion of the remaining filling material to form a light pipe, wherein a first polishing amount of the dielectric layer is greater than a second polishing amount of the remaining filling material during the second polishing process such that the top surface of the dielectric layer is lowered to a first level height and a top of a lens portion is located at a second level height higher than the first level height after performing the second polishing process.

18. The method according to claim 17, wherein a polishing thickness of the dielectric layer is greater than a minimum polishing thickness of the remaining filling material during the second polishing process.

19. The method according to claim 17, wherein a refractive index of the remaining filling material is higher than a refractive index of dielectric layer.

20. The method according to claim 17, wherein the second polishing process comprises a chemical mechanical polishing process, the portion of the remaining filling material is polished with a first polishing rate, the portion of the dielectric layer is polished with a second polishing rate, and the second polishing rate is higher than the first polishing rate.

* * * * *